United States Patent [19]
Wignot et al.

[11] Patent Number: 5,285,179
[45] Date of Patent: Feb. 8, 1994

[54] DOUBLE TUNED CIRCUIT WITH BALANCED OUTPUT AND IMAGE TRAP

[75] Inventors: Leroy S. Wignot, Indianapolis; Michael A. Pugel, Noblesville, both of Ind.

[73] Assignee: Thomson Consumer Electronics, Inc., Indianapolis, Ind.

[21] Appl. No.: 938,193

[22] Filed: Aug. 28, 1992

[51] Int. Cl.$^5$ ................................................. H03J 3/18
[52] U.S. Cl. ............................................ 334/15; 333/25; 455/180.4; 455/191.2
[58] Field of Search ................ 333/25, 177; 334/15; 358/191.1; 455/180.4, 191.2

[56]  References Cited

U.S. PATENT DOCUMENTS

| | | | |
|---|---|---|---|
| 3,903,487 | 9/1975 | Maier | 333/177 |
| 4,361,909 | 11/1982 | Theriault | 455/286 |
| 4,601,062 | 7/1986 | Hettiger | 455/285 |
| 4,662,001 | 4/1987 | Cruz et al. | 455/340 |
| 4,783,849 | 11/1988 | Muterspaugh | 455/197 |
| 5,020,146 | 5/1991 | Pugel | 334/15 X |
| 5,034,994 | 7/1991 | Muterspaugh et al. | 455/326 |

*Primary Examiner*—Paul Gensler
*Attorney, Agent, or Firm*—Joseph S. Tripoli; Peter M. Emanuel; Frederick A. Wein

[57]  ABSTRACT

Conversion of an RF signal amplifier from an unbalanced signal configuration to a balanced signal configuration is provided while including an image trap for both sides of the balanced circuit. The grounded side of the secondary of a double tuned circuit is lifted from ground to provide a balanced circuit configuration. A trap filter is provided in the balanced circuit configuration by a pair of small capacitors coupled between the balanced secondary leads to appropriate signal nodes.

5 Claims, 1 Drawing Sheet

DOUBLE TUNED CIRCUIT WITH BALANCED OUTPUT AND IMAGE TRAP

BACKGROUND

The present invention concerns RF tuning circuits for a television receiver, and more particularly a double tuned circuit with a balanced output having an image trap.

It is sometimes desirable to process RF signals in a balanced circuit configuration. In particular, a tuner integrated circuit (IC), the CXA1594L of the Sony Corporation, is designed for a balanced input signal to the UHF mixer. The data sheet for this IC shows the deriving of a balanced signal from a balun transformer. Balun transformers have the disadvantage of being larger and more expensive than RF transformers.

Additionally, it is often desirable that certain traps or filters be included in RF tuning circuits in order to prevent unwanted harmonics, beat frequencies, and images which are produced by extraneous signals and can have a detrimental effect on the processing of the desired signal. Some such traps are for a strong channel 7 signal which can interfere with a channel 6 signal, a 27 MHz trap against strong citizens band transmitters in the United States, and a trap for 890 MHz image signals produced by the transmissions of cellular telephones in the United States. It is herein recognized that when a trap or other filter is used to prevent detrimental effects of such extraneous signals in a balanced circuit, that it is necessary that such traps be used on both sides of the balanced configuration.

SUMMARY OF THE INVENTION

Briefly, the present invention concerns circuitry for the conversion of an RF signal amplifier from an unbalanced signal configuration to a balanced signal configuration while including an image trap for both sides of the balanced circuit. The grounded side of the secondary of a double tuned circuit is lifted from ground to provide a balanced circuit configuration. A trap filter is provided in the balanced circuit configuration by a pair of small capacitors coupled between the balanced secondary leads to appropriate signal nodes.

BRIEF DESCRIPTION OF THE DRAWINGS

Reference may be had to the drawings wherein like members are designated with like numerals, and wherein.

DETAILED DESCRIPTION OF THE PREFERRED EMBODIMENT

Figure 1:
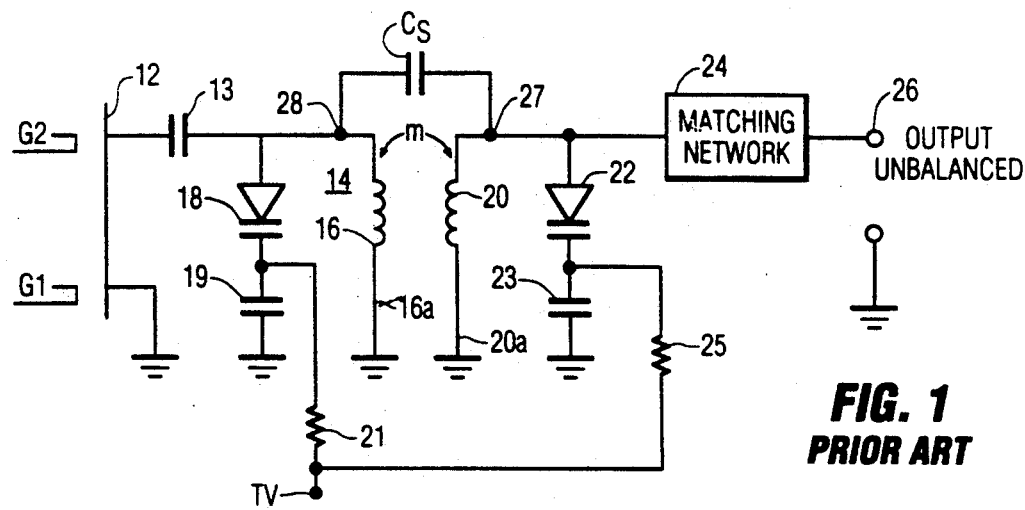
FIG. 1 shows a schematic of a prior art RF amplifier of an RF section including an image trap.

Referring now to FIG. 1, there is shown a portion of an exemplary tuner for a television set, FM radio receiver, or the like. For an exemplary range of frequencies, e.g., including the VHF and UHF bands, the RF input signal is derived from an antenna (not shown) or other source. The signal from the source is coupled to an RF amplifier 12, which in the exemplary embodiment is a dual gate FET amplifier. The output of amplifier 12 is fed through a coupling capacitor 13 to a double tuned transformer 14 having a primary coil 16 tuned with a primary capacitor, e.g., a varactor diode 18 in series with a trimmer capacitor 19, and a secondary coil 20 tuned by a secondary capacitor, e.g., a varactor diode 22 in series with a trimmer capacitor 23. Tuning is accomplished by application of a tuning voltage TV to varactor diodes 18 and 22 through respective resistors 21 and 25, thus changing the capacitance of varactor diodes 18, 22 in a manner well known in the art. The changing of the capacitance of varactor diodes 18, 22, responsive to tuning voltage TV, provides for the tuning selection of a desired channel from the plurality of channels of the RF input signal. Mutual magnetic coupling is provided between primary coil 16 and secondary coil 20. Coils 16 and 20 provide the DC return for respective varactor diodes 18, 22.

The configuration of transformer 14 is commonly called a doubly tuned circuit with one lead 16a, 20a, of respective coils 16 and 20 being coupled to a voltage reference (ground). The unbalanced output from transformer 14, is fed through impedance matching circuit 24 and provides an unbalanced signal for further signal processing (not shown), e.g., a SAW filter, video luminance, chrominance, and synchronization processing, as well as sound processing. In the exemplary embodiment, a portion of further RF processing circuitry is provided by the CXA1594L integrated circuit, i.e., mixing and IF amplification.

Still referring to FIG. 1, a capacitor $C_S$ is coupled from output signal node 27 at secondary coil 20 to input node 28 at primary coil 16. $C_S$ is a fraction of a picofarad, e.g., in the exemplary embodiment 0.15 pf, and can be provided as a capacitor formed by copper conductors on a printed circuit board. Capacitor $C_S$ operates in combination with the mutual inductance of transformer 14 to provide attenuation at an image notch frequency at output terminal 26, which in the exemplary embodiment is an image frequency of 890 MHz for cellular telephones in the United States. This frequency characteristic is shown in FIG. 2.

Figure 2:
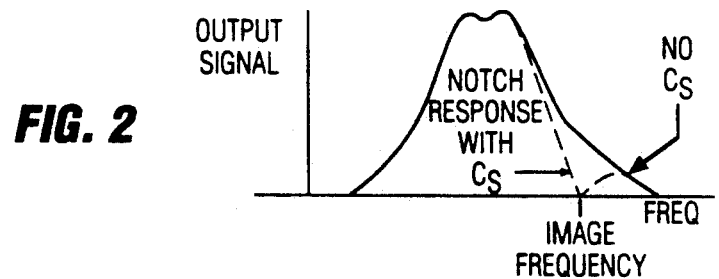
FIG. 2 is a graph of the amplitude vs frequency characteristic of the image trap of FIG. 1.

FIG. 2 shows the amplitude-frequency characteristic of double tuned circuit 14 having a center tuned pass band of frequencies with the upper skirt being modified to give an attenuation notch at a frequency to be rejected which is distal from the center of the pass band of frequencies.

Figure 3:
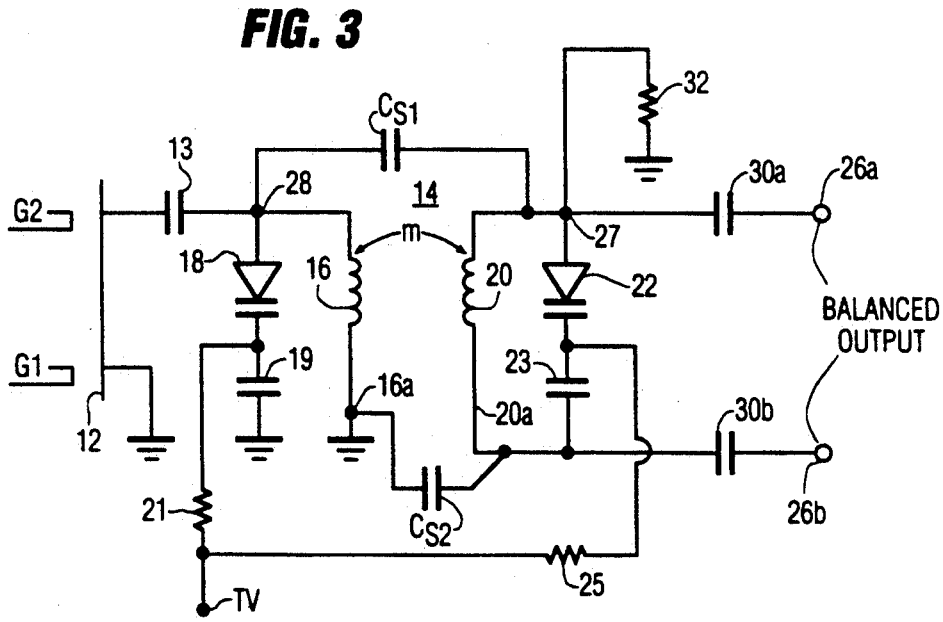
FIG. 3 shows a schematic of an RF amplifier according to aspects of the present invention.

The CXA1594L IC requires a balanced signal and balanced impedance at the signal input terminals of the UHF mixer. To accommodate these requirements, changes to the circuit of FIG. 1 are shown in FIG. 3, according to aspects of the present invention. Like members of FIG. 3 corresponding to members of FIG. 1 have been designated with like numerals.

For providing a balanced output, lead 20a of FIG. 1 has been decoupled from the reference potential (ground) and is coupled to a terminal 26b through coupling capacitor 30b. Output lead 26 remains coupled to terminal 26a through coupling capacitor 30a. Thus, the output voltage at terminals 26a and 26b is balanced with respect to ground and terminals 26a and 26b have balanced impedances with respect to ground. Since the DC return for varactor diode 22 has been lifted from ground, a relatively high DC return resistor 32 is provided.

For the balanced circuit, capacitor $C_S$ is divided into $C_{S1}$ and $C_{S2}$. In operation, capacitors $C_{S1}$ and $C_{S2}$ are in series. Thus, the values of each of the capacitors $C_{S1}$ and $C_{S2}$ must be doubled in value to equal the original value of capacitor $C_S$ to keep the same notch frequency. In practice, the values of $C_S$, $C_{S1}$, and $C_{S2}$ are much smaller in value than varactor diodes 18, 22.

What is claimed is:

1. In a television signal processing apparatus, tuning apparatus, comprising:

means for amplifying RF signals and having an output coupled to a signal node with respect to a reference potential, a first tuned circuit including a first varactor diode responsive to a first tuning voltage and a first inductance element coupled from the signal node to a point of reference potential for selecting one of said amplified RF signals in response to the first tuning voltage, a second tuned circuit including a second varactor diode responsive to a second tuning voltage and a second inductance element for further selecting said one of said amplified RF signals in response to the second tuning voltage, said first and second tuned circuits forming a double tuned circuit, said first and second inductance elements being inductively coupled, the second inductance element having a pair of output terminals balanced with respect to the reference potential, a first trap capacitor coupled between one output terminal of the second inductance element and the signal node, and a second trap capacitor coupled between the other output terminal of the second inductance element and the reference potential, the first and second trap capacitors providing a notch frequency for the tuned RF signal at each of the pair of output terminals.

2. The tuning apparatus of claim 1 wherein each of the first and second trap capacitors are smaller than the capacitance of the first and second varactor diodes.

3. The apparatus of claim 1 wherein the first and second tuning voltages are derived from a common tuning voltage.

4. The apparatus of claim 3 wherein the first and second tuning voltages are the same.

5. The apparatus of claim 1 wherein the first and second tuning voltages are the same.

* * * * *